(12) United States Patent  
Arima

(10) Patent No.: US 8,362,799 B2
(45) Date of Patent: Jan. 29, 2013

(54) SEMICONDUCTOR DEVICE, AND FAILURE DETECTION SYSTEM AND FAILURE DETECTION METHOD OF DATA HOLD CIRCUIT

(75) Inventor: Hideaki Arima, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/064,480

(22) Filed: Mar. 28, 2011

(65) Prior Publication Data

US 2011/0241724 A1   Oct. 6, 2011

(30) Foreign Application Priority Data

Mar. 30, 2010 (JP) .................................. 2010-078905

(51) Int. Cl.
 *H03K 19/003* (2006.01)
(52) U.S. Cl. .............................. 326/11; 326/12; 714/797

(58) Field of Classification Search ................ 326/9–11, 326/93, 95, 98; 327/144, 197–200; 365/156, 365/189.05, 194; 714/797
See application file for complete search history.

(56) References Cited

U.S. PATENT DOCUMENTS

2002/0074609 A1   6/2002 Maruyama
2010/0026338 A1*  2/2010 Fulcomer ........................ 326/11

FOREIGN PATENT DOCUMENTS

JP   2002-185309 A   6/2002

* cited by examiner

*Primary Examiner* — Shawki Ismail
*Assistant Examiner* — Jany Tran
(74) *Attorney, Agent, or Firm* — McGinn IP Law Group, PLLC

(57) ABSTRACT

A semiconductor device according to a first aspect of the present invention includes: a first circuit that outputs a first output value having a majority of output values received from N (N is three or more odd numbers) pieces of data hold circuits receiving a same input value; and a second circuit that outputs a second output value which is less than the majority of output values received from the N pieces of the data hold circuits.

18 Claims, 13 Drawing Sheets

| # | D | 101 | 102 | 103 | TEST=0 QX(Ma) | TEST=1 QX(Mi) | TEST RESULT Ma AND Mi | TEST RESULT Ma/Mi AND D |
|---|---|-----|-----|-----|---------------|---------------|------------------------|--------------------------|
| 1 | 0 | 0 | 0 | 0 | 0 | 0 | MATCH | MATCH |
| 2 | 1 | 1 | 1 | 1 | 1 | 1 | MATCH | MATCH |

Fig. 2

| # | D | I01 | I02 | I03 | TEST=0 | TEST=1 | TEST RESULT | |
|---|---|---|---|---|---|---|---|---|
| | | | | | QX(Ma) | QX(Mi) | Ma AND Mi | Ma/Mi AND D |
| 1 | 0 | 0 | 0 | 1 | 0 | 1 | MISMATCH | - |
| 2 | 0 | 0 | 1 | 0 | 0 | 1 | MISMATCH | - |
| 3 | 0 | 0 | 1 | 1 | 1 | 0 | MISMATCH | - |
| 4 | 0 | 1 | 0 | 0 | 0 | 1 | MISMATCH | - |
| 5 | 0 | 1 | 0 | 1 | 1 | 0 | MISMATCH | - |
| 6 | 0 | 1 | 1 | 0 | 1 | 0 | MISMATCH | - |
| 7 | 0 | 1 | 1 | 1 | 1 | 1 | MATCH | MISMATCH |
| 8 | 1 | 0 | 0 | 0 | 0 | 0 | MATCH | MISMATCH |
| 9 | 1 | 0 | 0 | 1 | 0 | 1 | MISMATCH | - |
| 10 | 1 | 0 | 1 | 0 | 0 | 1 | MISMATCH | - |
| 11 | 1 | 0 | 1 | 1 | 1 | 0 | MISMATCH | - |
| 12 | 1 | 1 | 0 | 0 | 0 | 1 | MISMATCH | - |
| 13 | 1 | 1 | 0 | 1 | 1 | 0 | MISMATCH | - |
| 14 | 1 | 1 | 1 | 0 | 1 | 0 | MISMATCH | - |

Fig. 3

| # | FD1 | I011 | I012 | I013 | TEST=0 | | TEST=1 | |
|---|---|---|---|---|---|---|---|---|
| | | | | | QR1 (Ma1) | SELECTION OF ADE | QR1 (Mi1) | SELECTION OF ADE |
| 1 | 0 | 0 | 0 | 0 | 0 | ADD1 | 0 | ADD1 |
| 2 | 0 | 0 | 0 | 1 | 0 | ADD1 | 1 | RAD1 |
| 3 | 0 | 0 | 1 | 0 | 0 | ADD1 | 1 | RAD1 |
| 4 | 0 | 0 | 1 | 1 | 1 | RAD1 | 0 | ADD1 |
| 5 | 0 | 1 | 0 | 0 | 0 | ADD1 | 1 | RAD1 |
| 6 | 0 | 1 | 0 | 1 | 1 | RAD1 | 0 | ADD1 |
| 7 | 0 | 1 | 1 | 0 | 1 | RAD1 | 0 | ADD1 |
| 8 | 0 | 1 | 1 | 1 | 1 | RAD1 | 1 | RAD1 |
| 9 | 1 | 0 | 0 | 0 | 0 | ADD1 | 0 | ADD1 |
| 10 | 1 | 0 | 0 | 1 | 0 | ADD1 | 1 | RAD1 |
| 11 | 1 | 0 | 1 | 0 | 0 | ADD1 | 1 | RAD1 |
| 12 | 1 | 0 | 1 | 1 | 1 | RAD1 | 0 | ADD1 |
| 13 | 1 | 1 | 0 | 0 | 0 | ADD1 | 1 | RAD1 |
| 14 | 1 | 1 | 0 | 1 | 1 | RAD1 | 0 | ADD1 |
| 15 | 1 | 1 | 1 | 0 | 1 | RAD1 | 0 | ADD1 |
| 16 | 1 | 1 | 1 | 1 | 1 | RAD1 | 1 | RAD1 |

Fig. 9

| # | SID1=FF1a | SID2=FF2a | SID3=FF3a | ACTIVATION OF TM |
|---|---|---|---|---|
| | | | | VALUE OF Q |
| 1 | 0 | 0 | 0 | 0 |
| 2 | 0 | 0 | 1 | 0 |
| 3 | 0 | 1 | 0 | 0 |
| 4 | 0 | 1 | 1 | 1 |
| 5 | 1 | 0 | 0 | 0 |
| 6 | 1 | 0 | 1 | 1 |
| 7 | 1 | 1 | 0 | 1 |
| 8 | 1 | 1 | 1 | 1 |

SEMICONDUCTOR DEVICE, AND FAILURE DETECTION SYSTEM AND FAILURE DETECTION METHOD OF DATA HOLD CIRCUIT

CROSS-REFERENCE TO RELATED APPLICATIONS

This application is based upon and claims the benefit of priority from Japanese patent application No. 2010-078905, filed on Mar. 30, 2010, the disclosure of which is incorporated herein in its entirety by reference.

BACKGROUND

The present invention relates to a semiconductor device, and a failure detection system and a failure detection method of a data hold circuit, and in particular, a semiconductor device, and a failure detection system and a failure detection method of a data hold circuit detecting a failure in the data hold circuit mounted on the semiconductor device, the data hold circuit including a plurality of flip-flop circuits or the like.

Along with a miniaturization of a chip in an area of the semiconductor device, the semiconductor device including a flip-flop circuit may be easily influenced by alpha rays, which results in malfunction. Hence, it is general to increase alpha-ray-resistance strength of a logic circuit by using a majority logic circuit including a plurality of flip-flop circuits for preventing the malfunction caused by the alpha rays. Further, in recent years, the miniaturization of a chip has been advancing, more and more semiconductor devices have been including a plurality of flip-flop circuits, and the number of flip-flop circuits mounted on the semiconductor device has been increasing. Therefore, there has been a growing need to perform the failure detection of the flip-flop circuit itself.

Japanese Unexamined Patent Application Publication No. 2002-185309 discloses a technique relating to a data hold circuit including at least three flip-flop circuits, and a majority logic circuit to output a signal according to a logical value of a majority in output values of the three flip-flop circuits. The data hold circuit has a circuit configuration so as to improve the reliability of data holding. Even if the output value of any one flip-flop circuit has changed when the alpha rays pass through any of the three flip-flop circuits, the data hold circuit can keep a correct output signal by output values of other flip-flop circuits. Further, the data hold circuit can detect a hardware failure of the flip-flop circuit.

FIG. 11 is a block diagram showing a configuration of a data hold circuit according to Japanese Unexamined Patent Application Publication No. 2002-185309. An alpha ray assurance flip-flop circuit 900 shown in FIG. 11 includes three flip-flop circuits FF1 to FF3, and a majority logic circuit MJR. Each of the flip-flop circuits FF1 to FF3 receives the same input data D through an input terminal TI1. The majority logic circuit MJR outputs a signal having the same logic as the output of the majority of output signals of the flip-flop circuits FF1 to FF3, that is, two or more flip-flop circuits having the same logic among the three flip-flop circuits.

The alpha ray assurance flip-flop circuit 900 outputs an output signal Q received from the majority logic circuit MJR through an output terminal TO1. Each of the flip-flop circuits FF1 to FF3 receives different clock signals CK1 to CK3 through input terminals TI2 to TI4. Each of the flip-flop circuits FF1 to FF3 is configured to receive and hold each of signals of the input data D in synchronization with the clock signals CK1 to CK3.

For example, by the alpha rays passing through any one of the flip-flop circuits FF1 to FF3, latch data held by the flip-flop circuit through which the alpha rays pass might invert. Even in this case, it is possible to prevent malfunction of the alpha ray assurance flip-flop circuit 900. This is because the inverted data is a minority value, thereby the majority logic circuit MJR ignores a change of the signal caused by the alpha rays.

Note that, the three clock signals CK1 to CK3 are supplied at the same timing, and can be generated, for example, by distributing an original clock signal by a plurality of clock buffers or the like. In this way, by separating the clock signals to latch each of the flip-flop circuits FF1 to FF3, it can prevent malfunction of the alpha ray assurance flip-flop circuit 900, even if noise caused by the alpha rays is generated in either one of clock signals. This is because there is only one flip-flop circuit in which an output signal is changed by the noise and the majority logic circuit MJR cuts a change of the signal by the noise.

FIG. 12 is a block diagram showing a configuration of flip-flop circuits which can realize a scan test according to Japanese Unexamined Patent Application Publication No. 2002-185309. A scan test circuit 900a shown in FIG. 12 is capable of performing a scan test compared with the configuration of the alpha ray assurance flip-flop circuit 900. The scan test circuit 900a includes three flip-flop circuits FF1a to FF3a, and the majority logic circuit MJR. Each of the flip-flop circuits FF1a to FF3a composes a scan pass for test. That is, the flip-flop circuits FF1a to FF3a have functions of scan-in and scan-out.

In particular, each of the flip-flop circuits FF1a to FF3a further receives different scan-in data SID1 to SID3 through input terminals TI5 to TI7, compared with the flip-flop circuits FF1 to FF3 of FIG. 11. Each of the flip-flop circuits FF1a to FF3a receives the same clock signal TM for scan through an input terminal TI8. Each of the flip-flop circuits FF1a to FF3a is configured to receive and hold each of signals of scan-in data SID1 to SID3 in synchronization with a clock signal TM for scan.

The scan test circuit 900a outputs scan-out data SOD1 to SOD3 received from the flip-flop circuits FF1a to FF3a through output terminals TO2 to TO4, respectively. Herewith, the scan test circuit 900a can transmit independent test values from the scan-in data SID1 to SID3 to the scan-out data SOD1 to SOD3 corresponding to each of the flip-flop circuits FF1a to FF3a. Therefore, it can test each of the flip-flop circuits FF1a to FF3a or the majority logic circuit MJR.

FIG. 13 is a diagram showing an operational truth table of the scan test circuit 900a shown in FIG. 12. SID1 to SID3 of FIG. 13 are values of holding statuses of the flip-flop circuits FF1a to FF3a. The value of Q of FIG. 13 is a value of the output signal Q of the majority logic circuit MJR.

SUMMARY

However, the present inventors have found a problem that the test time becomes long, when a failure of the flip-flop circuits FF1a to FF3a is detected using the above described scan test circuit 900a.

This is because it is necessary to execute combinational tests (eight ways) of data values indicated in the operational truth table shown in FIG. 13 to verify that three flip-flop circuits FF1a to FF3a and the majority logic circuit MJR operate normally on the scan test circuit 900a of FIG. 12. In this case, it is necessary to sequentially set the scan-in data SID1 to SID3 again to each combination shown in FIG. 13, and to execute a special test to output different data to the flip-flop circuits FF1a to FF3a through the input terminals TI5 to TI7.

Further, it is necessary to test an operation of the scan test circuit 900a for a combination of the input data D in a usual operation (two values of "0" and "1"), because a pass in the test using the scan-in data SID1 to SID3 of the scan test circuit 900a of FIG. 12 is different from a pass from the input data D in a usual operation to a logical value of the output signal Q. Accordingly, it needs 10 ways (eight ways+two ways) by combination of data values performing the usual operation and the scan test in Japanese Unexamined Patent Application Publication No. 2002-185309.

A first aspect of the present invention is a semiconductor device that includes: a first circuit (for example, a majority logic circuit MJR according to a first embodiment of the present invention) that outputs a first output value having a majority of output values received from N (N is three or more odd numbers) pieces of data hold circuits (for example, flip-flop circuit FF1 to FF3 according to the first embodiment of the present invention) receiving a same input value; and a second circuit (for example, a minority value determination circuit MIR according to the first embodiment of the present invention) that outputs a second output value which is less than the majority of output values received from the N pieces of the data hold circuits.

A second aspect of the present invention is a failure detection system of a data hold circuit that includes: a first circuit that outputs a first output value having a majority of output values received from N (N is three or more odd numbers) pieces of data hold circuits receiving a same input value; a second circuit that outputs a second output value which is less than the majority of output values received from the N pieces of the data hold circuits; and a detection circuit that detects a failure of the N pieces of the data hold circuits based on the second output value.

A third aspect of the present invention is a failure detection method of a data hold circuit that includes: outputting a first output value having a majority of output values received from N (N is three or more odd numbers) pieces of data hold circuits receiving a same input value; outputting a second output value which is less than the majority of output values received from the N pieces of the data hold circuits; and detecting a failure of the N pieces of the data hold circuits based on the second output value.

A fourth aspect of the present invention is a failure detection method of N (N is three or more odd numbers) pieces of data hold circuits mounted on a semiconductor device, the failure detection method including: supplying an input value to each of the N pieces of data hold circuits, the input value (for example, a fuse data FD1 according to a third embodiment of the present invention) indicating presence or absence of a failure in an area shown by an address of a memory (for example, a memory cell MC according to the third embodiment of the present invention); outputting a first output value of a majority of output values received from the N pieces of the data hold circuits when receiving a write instruction to write input data to a first address of the memory; determining whether there is the failure in the area based on the first output value; writing the input data to the first address when there is no failure in the area; writing the input data to a second address when there is the failure in the area, the second address being different from the first address; outputting a second output value which is less than the majority of output values received from the N pieces of the data hold circuits when receiving a read instruction to read output data from the first address of the memory; determining whether there is the failure in the area based on the second output value; reading the output data from the first address when there is no failure in the area; reading the output data from the second address when there is the failure in the area; and detecting that there is the failure in the N pieces of the data hold circuits according to the input data and the output data that is read.

In each of the first to fourth aspects of the present invention, two data of the first output value and the second output value are output for one input data. Therefore, when there is a failure in any one of the data hold circuits, it can detect the failure, because a combination of the input value, the first output value, and the second output value is different from a combination of values when there is no failure in any one of the data hold circuits. Accordingly, for example, when there are three flip-flop circuits, it is not necessary to test the above described 10 ways, thereby it can shorten a test time.

According to the present invention, it is possible to provide a semiconductor device, and a failure detection system and a failure detection method of a data hold circuit that are capable of shortening the test time to detect failures of a plurality of data hold circuits mounted on the semiconductor device.

BRIEF DESCRIPTION OF THE DRAWINGS

The above and other aspects, advantages and features will be more apparent from the following description of certain embodiments taken in conjunction with the accompanying drawings, in which:

FIG. 2 is a diagram showing an operational truth table when there is no failure in a data hold circuit according to the first embodiment of the present invention;

FIG. 3 is a diagram showing an operational truth table when there is no failure in a data hold circuit according to the first embodiment of the present invention;

FIG. 9 is a diagram showing an operational truth table according to the third embodiment of the present invention;

FIG. 13 is a diagram showing an operational truth table of the scan test circuit according to the related art.

DETAILED DESCRIPTION

Figure 1:
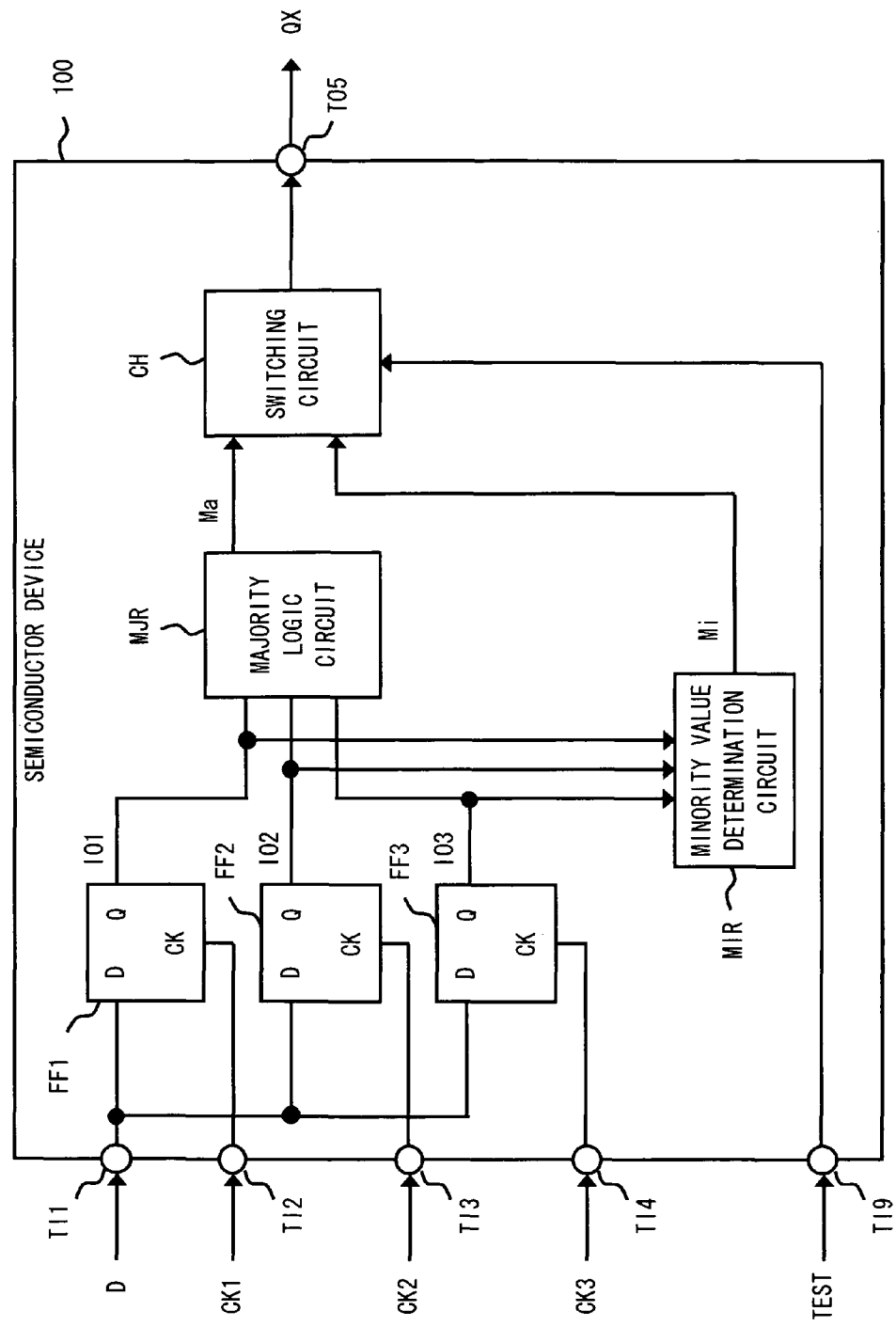
FIG. 1 is a block diagram showing a configuration of a semiconductor device according to a first embodiment of the present invention.

Hereinafter, specific embodiments to which the present invention is applied will be described in detail with reference to the accompanying drawings. In the drawings, the same components are denoted by the same reference symbols, and redundant explanation thereof is omitted as appropriate to clarify the explanation.

[First Embodiment]

Figure 11:
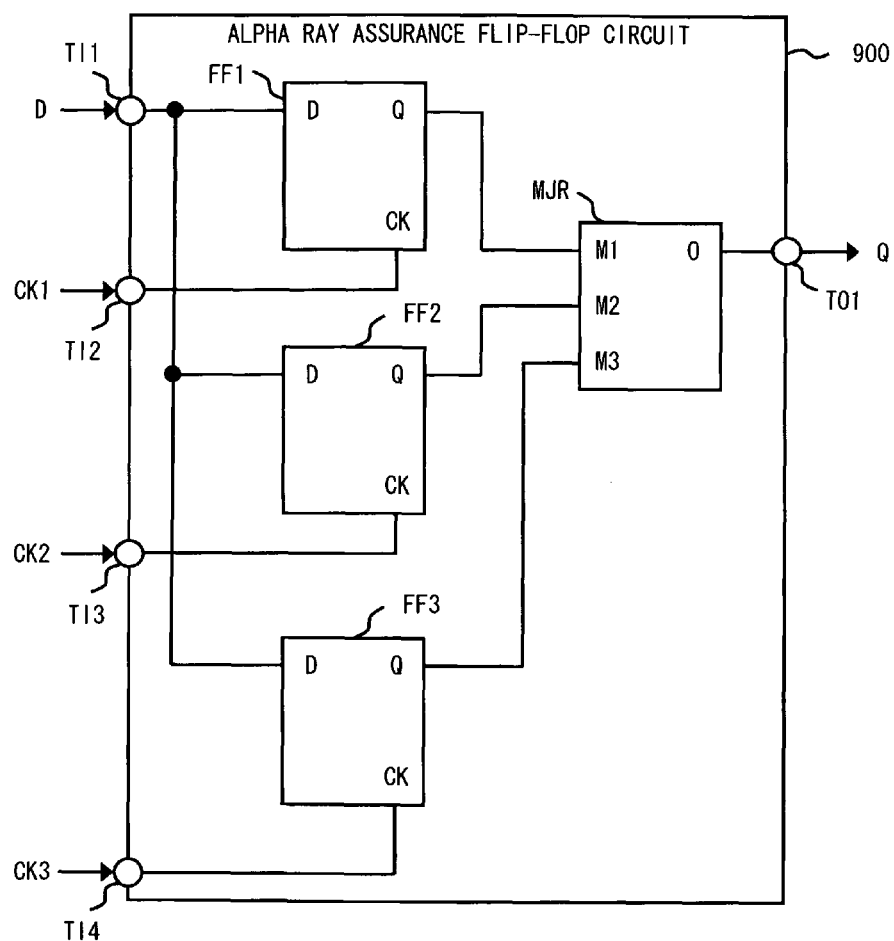
FIG. 11 is a block diagram showing a configuration of an alpha ray assurance flip-flop circuit according to a related art.
Figure 12:
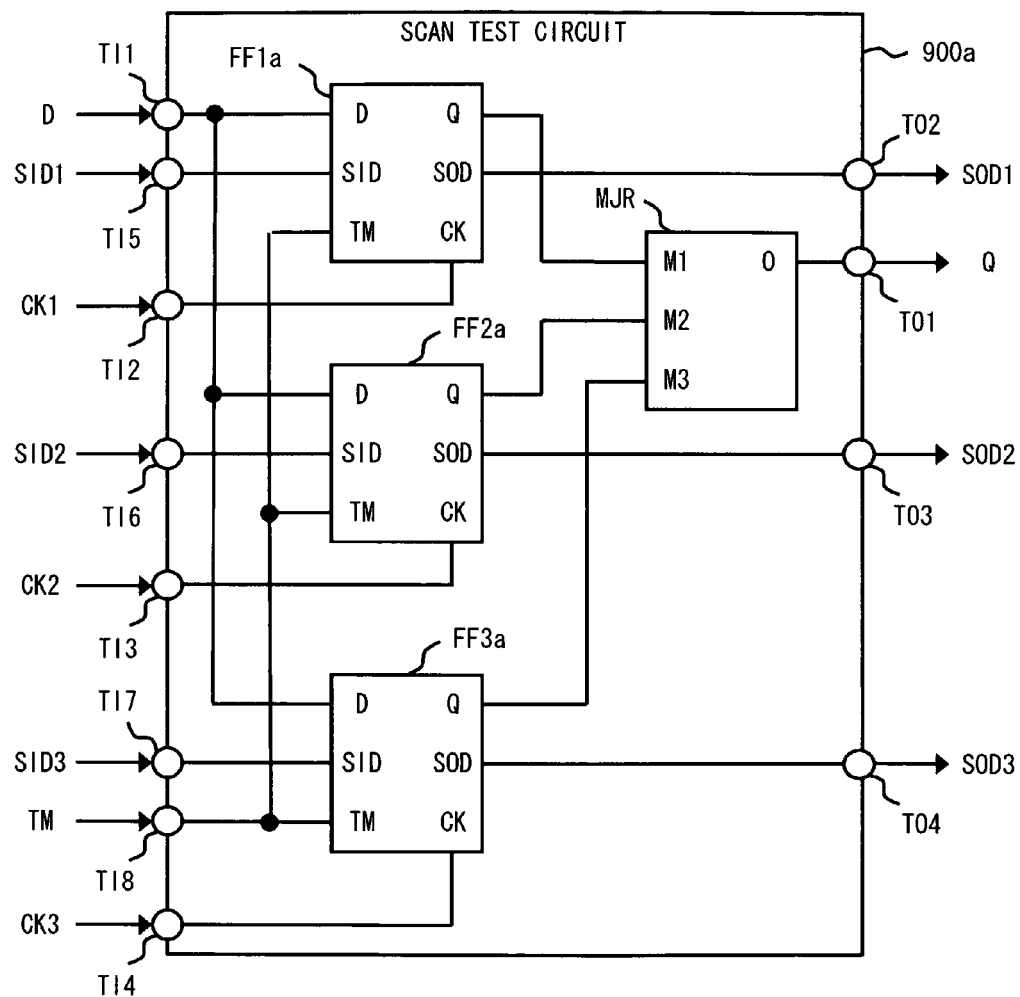
FIG. 12 is a block diagram showing a configuration of a scan test circuit according to the related art.

FIG. 1 is a block diagram showing a configuration of a semiconductor device 100 according to a first embodiment of the present invention. The semiconductor device 100 is a logic circuit having high alpha-ray-resistance strength, to prevent malfunction by alpha rays. The semiconductor device 100 includes flip-flop circuits FF1 to FF3, a majority logic circuit MJR, a minority value determination circuit MIR, and a switching circuit CH. Note that, the semiconductor device 100 may be obtained by adding the minority value determination circuit MIR and the switching circuit CH to the alpha ray assurance flip-flop circuit 900 shown in FIG. 11.

The semiconductor device 100 receives an input data D through an input terminal TI1, receives a clock signal CK1 through an input terminal TI2, receives a clock signal CK2 through an input terminal TI3, receives a clock signal CK3 through an input terminal TI4, and receives a test signal TEST through an input terminal TI9. The input data D is a signal that shows one of two values. For example, the input data D shows one of "0" and "1". The test signal TEST is a signal to instruct one of a usual operation and a test operation. For example, "0" instructs the usual operation, and "1" instructs the test operation.

The semiconductor device 100 supplies the input data D and the clock signal CK1 to the flip-flop circuit FF1, supplies the input data D and the clock signal CK2 to the flip-flop circuit FF2, supplies the input data D and the clock signal CK3 to the flip-flop circuit FF3, and supplies the test signal TEST to the switching circuit CH. The semiconductor device 100 outputs an output signal QX to be output from the switching circuit CH through an output terminal TO5.

The flip-flop circuits FF1 to FF3 are examples of data hold circuits. The flip-flop circuits FF1 to FF3 receive the input data D, outputs flip-flop output signals IO1 to IO3 according to the clock signals CK1 to CK3, respectively, and supplies the flip-flop output signals IO1 to IO3 to the majority logic circuit MJR and the minority value determination circuit MIR. Note that, the number of the flip-flop circuits mounted on the semiconductor device 100 according to the first embodiment of the present invention is an odd number of three or more. That is, the flip-flop circuits FF1 to FF3 are three or more odd number of data hold circuits which receive the input data D having the same input value.

The flip-flop output signals IO1 to IO3 are signals which show holding status of the input data D in the flip-flop circuits FF1 to FF3. In some cases, one or all of the flip-flop circuits FF1 to FF3 malfunction, and the input data D inverts, by an influence of alpha rays. Accordingly, in some cases, the flip-flop output signals IO1 to IO3 are different from one another.

The majority logic circuit MJR receives the flip-flop output signals IO1 to IO3, outputs a majority value signal Ma which is a result of a majority voting of the flip-flop output signals IO1 to IO3, and supplies the majority value signal Ma to the switching circuit CH. That is, the majority logic circuit MJR compares three values of the flip-flop output signals IO1 to IO3, and outputs a logical value of the majority of output values received from the flip-flop circuits FF1 to FF3 as the majority value signal Ma. In other words, the majority logic circuit MJR is a first circuit that outputs a first output value of the majority of output values received from the flip-flop circuits FF1 to FF3.

The minority value determination circuit MIR receives the flip-flop output signals IO1 to IO3, outputs a minority value signal Mi which is a minority value of the flip-flop output signals IO1 to IO3, and supplies the minority value signal Mi to the switching circuit CH. That is, the minority value determination circuit MIR compares three values of the flip-flop output signals IO1 to IO3, and outputs a logical value which is less than the majority of output values received from the flip-flop circuits FF1 to FF3 as the minority value signal Mi. In other words, the minority value determination circuit MIR is a second circuit that outputs a second output value which is less than the majority of output values received from the flip-flop circuits FF1 to FF3.

When one of the flip-flop circuits FF1 to FF3 malfunctions by the alpha rays, that is, when there is a failure in any one of the circuits, a value of the majority value signal Ma and a value of the minority value signal Mi are different. Therefore, it is possible to detect whether there is a failure in the N (N is three or more odd numbers) pieces of the data hold circuits, using the first output value and the second output value for an input value which is one of two values by the majority logic circuit MJR and the minority value determination circuit MIR.

Note that, when all of output values received from the flip-flop circuits FF1 to FF3 coincide with one another, the minority value determination circuit MIR outputs the output value as the minority value signal Mi. Herewith, it can detect a case in which all of the data hold circuits are normal, by comparing the second output value with the input value.

The switching circuit CH includes functions receiving the majority value signal Ma, the minority value signal Mi, and the test signal TEST, and switching an output signal of the majority logic circuit MJR and an output signal of the minority value determination circuit MIR according to the test signal TEST. That is, the switching circuit CH selects one of the majority value signal Ma and the minority value signal Mi, and outputs the selected value as the output signal QX. In other words, the switching circuit CH is an output selection circuit that selects one of the first output value and the second output value according to an instruction from outside, and outputs the selected value. Herewith, it can apply the semiconductor device which can detect the presence or absence of a failure in the N pieces of the data hold circuits, using the first output value and the second output value, in place of an existing semiconductor device including N pieces of the data hold circuits.

Further, the switching circuit CH determines whether the test signal TEST is the usual operation or the test operation. When it determines that the test signal TEST is the usual operation, the switching circuit CH selects and outputs the majority value signal Ma. When it determines that the test signal TEST is the test operation, the switching circuit CH selects and outputs the minority value signal Mi. Herewith, it can perform the test operation while providing an existing function in the usual operation.

FIG. 2 and FIG. 3 are diagrams showing operational truth tables of the semiconductor device 100 according to the first embodiment of the present invention. Items of the operational truth tables shown in FIG. 2 and FIG. 3 show the input data D, the flip-flop output signals IO1 to IO3, QX (Ma), QX (Mi), and the test result. The QX (Ma) shows the output signal QX when the test signal TEST is "0", that is, the majority value signal Ma. The QX (Mi) shows the output signal QX when the test signal TEST is "1", that is, the minority value signal Mi. The test result shows match or mismatch between the majority value signal Ma and the minority value signal Mi. When the majority value signal Ma and the minority value signal Mi match, it shows match or mismatch between the input data D and one of the majority value signal Ma and the minority value signal Mi.

FIG. 2 is a diagram showing the operational truth table when there is no failure in any one of the flip-flop circuits FF1 to FF3 according to the first embodiment of the present invention. An operation when there is no failure in any one of the flip-flop circuits FF1 to FF3 will be described with reference to FIG. 2. First, when the input data D received by the semiconductor device 100 is "0", the flip-flop circuits FF1 to FF3 output the flip-flop output signals IO1 to IO3 as "0" to the majority logic circuit MJR and the minority value determination circuit MIR by activation of the clock signals CK1 to CK3.

Next, each of the majority logic circuit MJR and the minority value determination circuit MIR compares values of the flip-flop output signals IO1 to IO3. In this case, both of the majority value signal Ma and the minority value signal Mi become "0". Further, when the test signal TEST is inactive (hereafter, "0" is assumed to be inactive), the switching circuit CH outputs the majority value signal Ma as the output signal QX. Alternatively when the test signal TEST is active (hereafter, "1" is assumed to be active), the switching circuit CH outputs the minority value signal Mi as the output signal QX.

Alternatively, when the input data D received by the semiconductor device 100 is "1", the flip-flop circuits FF1 to FF3 output the flip-flop output signals IO1 to IO3 as "1" to the majority logic circuit MJR and the minority value determination circuit MIR by an activation of the clock signals CK1 to CK3.

Further, each of the majority logic circuit MJR and the minority value determination circuit MIR compares a value of the flip-flop output signals IO1 to IO3. In this case, both of the majority value signal Ma and the minority value signal Mi become "1". Furthermore, when the test signal TEST is "0", the switching circuit CH outputs the majority value signal Ma as the output signal QX. Alternatively when the test signal TEST is "1", the switching circuit CH outputs the minority value signal Mi as the output signal QX.

In this way, when there is no failure in any one of the flip-flop circuits FF1 to FF3, the QX (Ma) and the QX (Mi) match, regardless of whether the input data D is "0" or "1". In addition, the QX (Ma) and the QX (Mi) match the input data D. Therefore, when the test result of FIG. 2 is obtained, it can detect that there is no failure in any one of the flip-flop circuits FF1 to FF3.

FIG. 3 is a diagram showing the operational truth table when there is a failure in one or all the flip-flop circuits FF1 to FF3 according to the first embodiment of the present invention. An operation when there is a failure only in the flip-flop circuit FF3 will be described with reference to FIG. 3. First, when the input data D is "0", the flip-flop circuits FF1 and FF2 output the flip-flop output signals IO1 and IO2 as "0". However, the flip-flop circuit FF3 outputs the flip-flop output signal IO3 as "1".

Next, the majority logic circuit MJR outputs the majority value signal Ma as "0", because two flip-flop output signals IO1 and IO2 are "0". By contrast, the minority value determination circuit MIR outputs the minority value signal Mi as "1", because only the flip-flop output signal IO3 is "1". Further, when the test signal TEST is "0", the switching circuit CH outputs "0" as the output signal QX. Alternatively when the test signal TEST is "1", the switching circuit CH outputs "1" as the output signal QX.

In this way, the test result is "MISMATCH", because the QX (Ma) is "0", and the QX (Mi) is "1". Alternatively, also when the input data D is "1", the test result is "MISMATCH", because the QX (Ma) is "1", and the QX (Mi) is "0". Therefore, when the test result of #1 or #14 of FIG. 3 is obtained, it can detect that there is a failure in a part of the flip-flop circuits FF1 to FF3. When there is the failure only in any one of the flip-flop circuits FF1 and FF2, this is similar, because the test result of #2, #4, #11, or #13 of FIG. 3 are obtained.

Next, an operation when there are failures in two flip-flop circuits FF2 and the FF3 will be described. First, when the input data D is "0", the flip-flop circuit FF1 outputs the flip-flop output signal IO1 as "0". However, the flip-flop circuits FF2 and FF3 output the flip-flop output signals IO2 and IO3 as "1".

Second, the majority logic circuit MJR outputs the majority value signal Ma as "1", because two flip-flop output signals IO2 and IO3 are "1". By contrast, the minority value determination circuit MIR outputs the minority value signal Mi as "0", because only the flip-flop output signal IO1 is "0". Further, when the test signal TEST is "0", the switching circuit CH outputs "1" as the output signal QX. Alternatively when the test signal TEST is "1", the switching circuit CH outputs "0" as the output signal QX.

In this way, the test result is "MISMATCH", because the QX (Ma) is "1", and the QX (Mi) is "0". Alternatively, also when the input data D is "1", the test result is "MISMATCH", because the QX (Ma) is "0", and the QX (Mi) is "1". Therefore, when the test result of #3 or #12 of FIG. 3 is obtained, it can detect that there is the failure in a part of the flip-flop circuits FF1 to FF3. When there is the failure in two of the flip-flop circuits FF1 and FF2 or FF1 and FF3, this is similar, because the test result of #5, #6, #9, or #10 of FIG. 3 is obtained.

Finally, an operation when there are failures in all of the flip-flop circuits FF1 to FF3 will be described. First, when the input data D is "0", the flip-flop circuits FF1 to FF3 output the flip-flop output signals IO1 to IO3 as "1".

Second, the majority logic circuit MJR outputs the majority value signal Ma as "1", because three of the flip-flop output signals IO1 to IO3 are "1". By contrast, the minority value determination circuit MIR outputs the minority value signal Mi as "1", because three of the flip-flop output signals IO1 to IO3 match "1". Further, when the test signal TEST is "0", the switching circuit CH outputs "1" as the output signal QX. Alternatively when the test signal TEST is "1", the switching circuit CH outputs "1" as the output signal QX.

In this way, when there is the failure in all of the flip-flop circuits FF1 to FF3, the QX (Ma) and the QX (Mi) match. However, the input data D and one of the QX (Ma) and the QX (Mi) do not match, because the QX (Ma) and the QX (Mi) are "1", and the input data D is "0". Alternatively, also when the input data D is "1", the input data D and one of the QX (Ma) and the QX (Mi) do not match, because the QX (Ma) and the QX (Mi) are "0", and the input data D is "1". Accordingly, the test result is "MISMATCH". Therefore, when the test result of #7 or #8 of FIG. 3 is obtained, it can detect that there is the failure in all of the flip-flop circuits FF1 to FF3.

From the above description, in the first embodiment of the present invention, it can perform the test to detect the failure in the flip-flop circuits FF1 to FF3, only by two ways that the input data D is "0" and "1". Therefore, the test time can be shortened compared with Japanese Unexamined Patent Application Publication No. 2002-185309. Further, when it outputs directly the majority value signal Ma and the minority value signal Mi from the semiconductor device 100 without using the switching circuit CH, it can detect the failure by comparing the majority value signal Ma, the minority value signal Mi and the input data D, without using the test signal TEST. When it is rare that a plurality of the flip-flop circuits FF1 to FF3 fail at the same time, it may be able to detect that there is the failure in at least one of the flip-flop circuits FF1 to FF3. In this case, it can determine whether there is the failure, by comparing at least the minority value signal Mi with the input data D.

[Second Embodiment]

Figure 4:
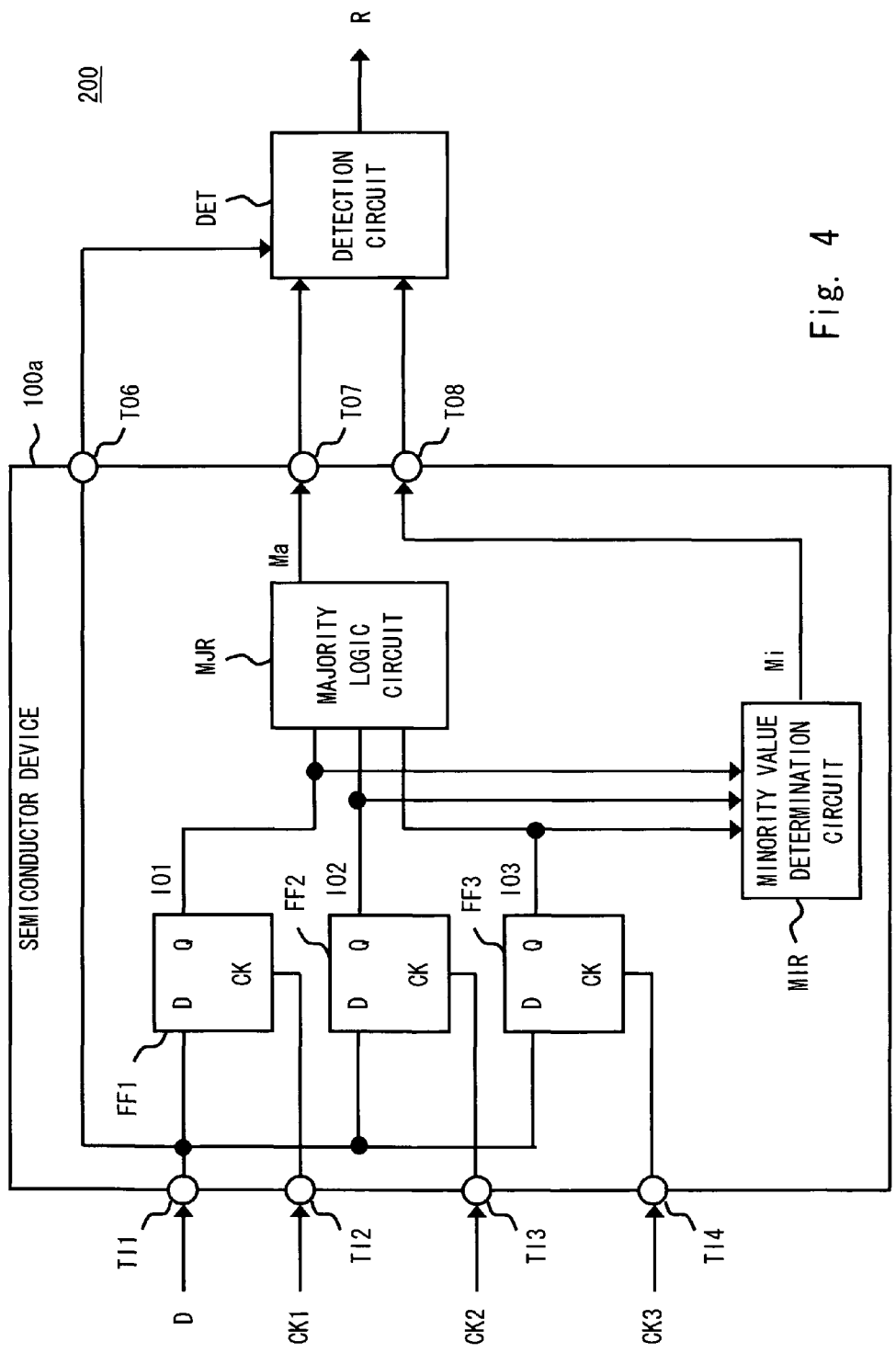
FIG. 4 is a block diagram showing a configuration of a failure detection system according to a second embodiment of the present invention.

FIG. 4 is a block diagram showing a configuration of a failure detection system 200 according to a second embodiment of the present invention. The failure detection system 200 includes a semiconductor device 100a, and a detection circuit DET. The semiconductor device 100a includes at least the flip-flop circuits FF1 to FF3, the majority logic circuit MJR, and the minority value determination circuit MIR among the configurations of the semiconductor device 100 according to the first embodiment of the present invention. As is different from the semiconductor device 100, the semiconductor device 100a outputs an input data D through an output terminal TO6, outputs a majority value signal Ma to be output from the majority logic circuit MJR through an output terminal TO7, and outputs a minority value signal Mi to be output from the minority value determination circuit MIR through an output terminal TO8.

The detection circuit DET receives the input data D, the majority value signal Ma, and the minority value signal Mi, and outputs the determination result R. The determination result R is information that shows a result obtained by determining whether there is a failure in one or all of the flip-flop circuits FF1 to FF3. The detection circuit DET is a detection circuit that detects that there is the failure in the N pieces of the data hold circuits based on at least the minority value signal Mi. Note that, the detection circuit DET may not receive data from the semiconductor device 100a, if the detection circuit DET receives the same data as the input data D to be input to the semiconductor device 100a.

The detection circuit DET detects that there is the failure in the data hold circuits of less than the majority of the N pieces of the data hold circuits, when the minority value signal Mi is different from the input value D. Further, the detection circuit DET detects that there is the failure in a part of the N pieces of the data hold circuits, when the majority value signal Ma is different from the minority value signal Mi.

As presented above, when all of output values received from the N pieces of the data hold circuits coincide with one another, the minority value determination circuit MIR outputs the coincided output value as the minority value signal Mi. In this case, the detection circuit DET performs the failure detection according to the input value D and one of the majority value signal Ma and the minority value signal Mi, when the majority value signal Ma and the minority value signal Mi match.

Furthermore, the detection circuit DET detects that there is the failure in all of the N pieces of the data hold circuits, when the majority value signal Ma and the minority value signal Mi match, and when one of the majority value signal Ma and the minority value signal Mi is different from the input value D. Herewith, it can improve the accuracy of failure detection, because it can detect that there are failures in all of the data hold circuits.

Note that, the failure detection system 200 may further include the switching circuit CH according to the first embodiment of the present invention. In this case, the detection circuit DET may perform the failure detection according to the output value received from the switching circuit CH and the input data D.

Figure 5:
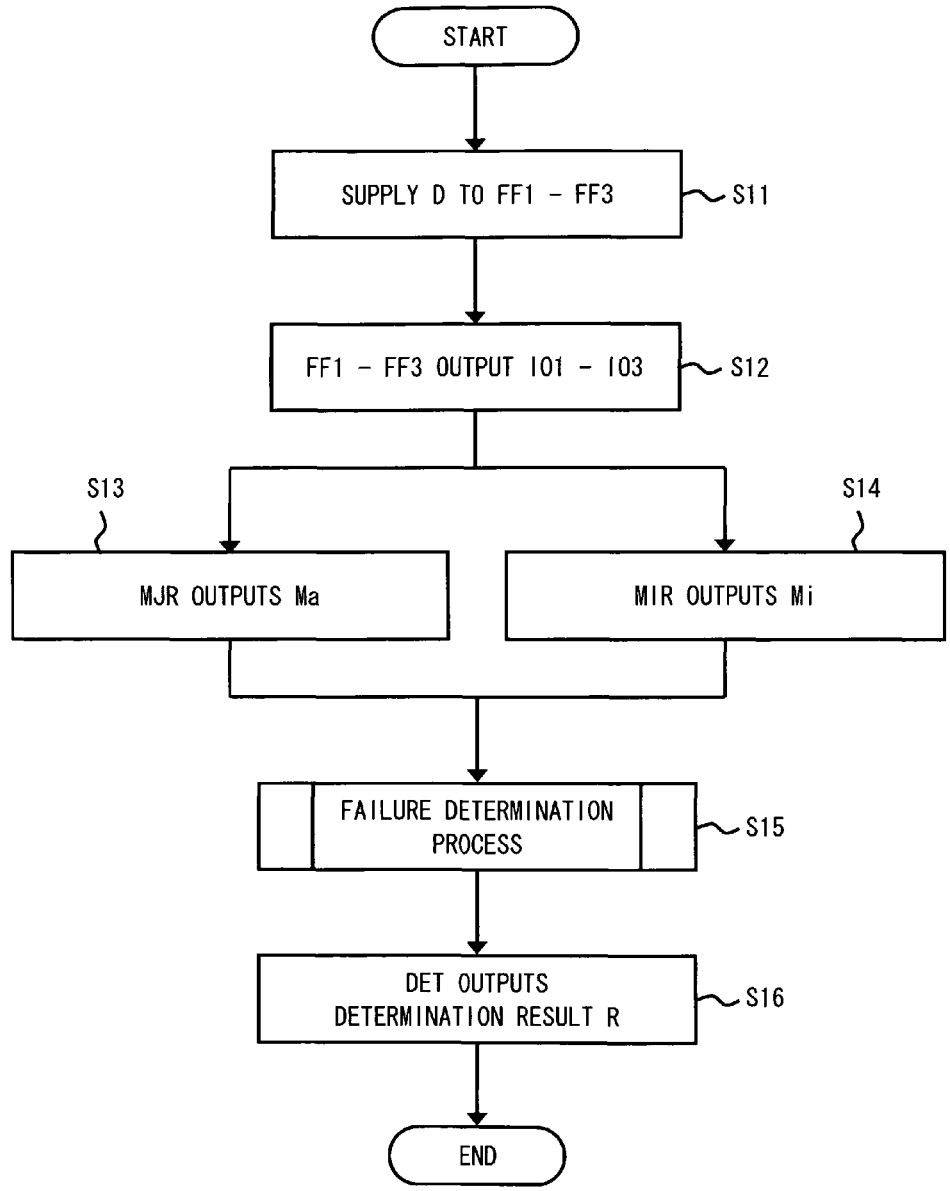
FIG. 5 is a flowchart showing the flow of a failure detection process according to the second embodiment of the present invention.

FIG. 5 is a flowchart showing the flow of a failure detection process according to the second embodiment of the present invention. First, the semiconductor device 100a supplies the input data D to each of the flip-flop circuits FF1 to FF3 (S11). Second, the flip-flop circuits FF1 to FF3 output the flip-flop output signals IO1 to IO3 according to the clock signals CK1 to CK3, respectively (S12).

Subsequently, the majority logic circuit MJR compares the flip-flop output signals IO1 to IO3 to be received, and outputs the majority value signal Ma (S13). Further, the minority value determination circuit MIR compares the flip-flop output signals IO1 to IO3 to be received, and outputs the minority value signal Mi (S14).

After that, the detection circuit DET performs a failure determination process based on the majority value signal Ma, the minority value signal Mi, and the input data D to be received (S15). Note that, details of the failure determination process are described later in FIG. 6. After that, the detection circuit DET outputs the determination result R (S16).

Figure 6:
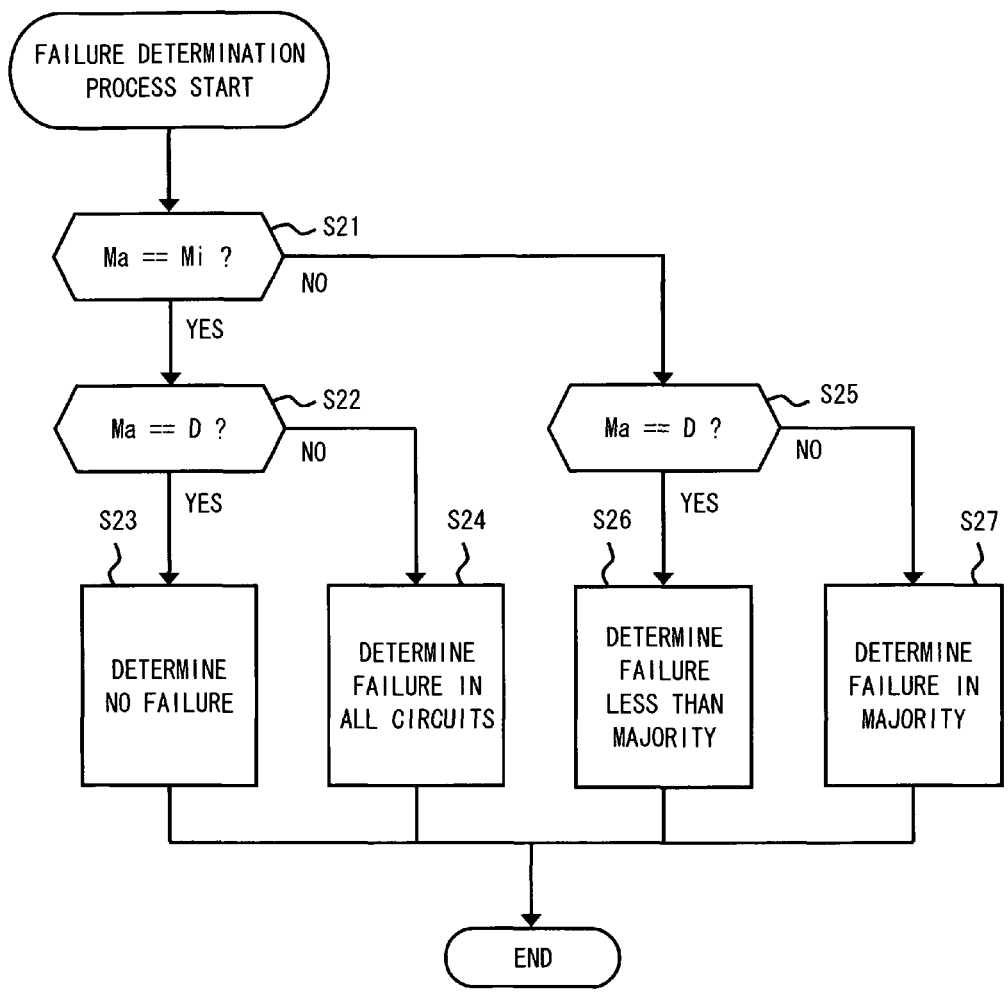
FIG. 6 is a flowchart showing the flow of a failure determination process according to the second embodiment of the present invention.

FIG. 6 is a flowchart showing the flow of the detail of the failure determination process according to the second embodiment of the present invention. First, the detection circuit DET determines whether the majority value signal Ma and the minority value signal Mi match (S21). When it is determined that the majority value signal Ma and the minority value signal Mi match, the detection circuit DET determines whether the majority value signal Ma and the input data D match (S22). When it determined that the majority value signal Ma and the input data D match, the detection circuit DET determines that there is no failure in any one of the flip-flop circuits FF1 to FF3 (S23). When it determined that the majority value signal Ma and the input data D does not match by the step S22, the detection circuit DET determines that there is the failure in all of the flip-flop circuits FF1 to FF3 (S24).

When it determined that the majority value signal Ma and the minority value signal Mi does not match by the step S21, the detection circuit DET determines whether the majority value signal Ma and the input data D match (S25). When it determined that the majority value signal Ma and the input data D match, the detection circuit DET determines that there is the failure in the data hold circuits of less than the majority of the N pieces of the data hold circuits, that is, there is the failure in one circuit (S26). When it determined that the majority value signal Ma and the input data D does not match by the step S25, the detection circuit DET determines that there are failures in the majority of the flip-flop circuits FF1 to FF3, that is, there are failures in two circuits (S27).

Note that, at the steps S22 and S25 of FIG. 5, the minority value signal Mi may be used for the comparison instead of the majority value signal Ma.

Further, the test result of FIG. 2 or FIG. 3 is obtained by performing the process of FIG. 5 in each case that the input data D is "0" and "1".

Note that, as a method to detect status of match or mismatch between the majority value signal Ma and the minority value signal Mi, shown in the operational truth tables of FIG. 2 and FIG. 3, an EXOR circuit may be used instead of the switching circuit CH according to the first embodiment of the present invention. Further, by comparing the output result of the EXOR circuit with the input data D, it can obtain an effect of the failure detection which is similar to that of the first embodiment of the present invention.

From the above-mentioned, the test time to detect the failure in a plurality of data hold circuits can be shortened by the second embodiment of the present invention.

[Third Embodiment]

Figure 7:
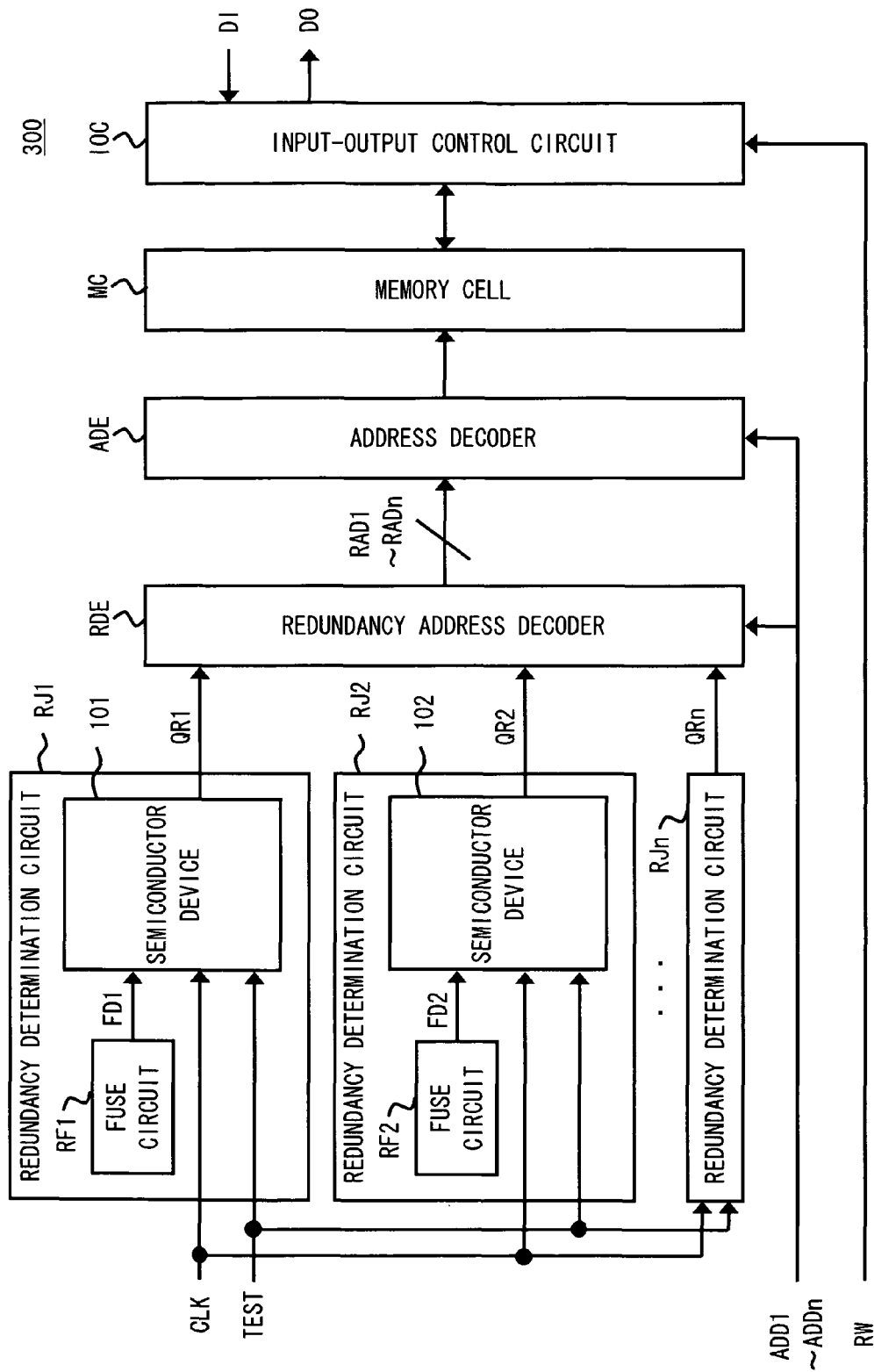
FIG. 7 is a block diagram showing a configuration of a semiconductor storage device according to a third embodiment of the present invention.

A third embodiment of the present invention is a test method of a semiconductor device including N pieces of the data hold circuits. A semiconductor storage device 300 according to the third embodiment of the present invention is an example of a semiconductor device when the semiconductor device 100 according to the first embodiment of the present invention is included in a redundancy determination circuit. The test method according to the third embodiment of the present invention suppresses test time in a production process by testing the semiconductor storage device itself and detecting a failure in the redundancy determination circuit. FIG. 7 is a block diagram showing a configuration of the semiconductor storage device 300 according to the third embodiment of the present invention. The semiconductor storage device 300 includes redundancy determination circuits RJ1, RJ2, . . . , and RJn (n is a natural number of one or more), a redundancy address decoder RDE, an address decoder ADE, a memory cell MC, and an input-output control circuit IOC.

The memory cell MC is an example of a configuration unit of a memory to store data in an area shown by an address. The input-output control circuit IOC is a circuit to receive a write instruction or a read instruction from outside, to control an access for the memory cell MC, and to output a result. The write instruction includes a specification of a writing target address in the memory cell MC and a specification of the input data DI of the writing target address. The read instruction includes a specification of a reading target address in the memory cell MC. In particular, the input-output control circuit IOC determines whether the received instruction from outside is the write instruction or the read instruction by a specification of a control signal RW, and performs a process. Hereinafter, as an example, it is assumed that the received instruction indicates the write instruction, when the control signal RW is "0", and that the received instruction indicates the read instruction, when the control signal RW is "1". Note that, when the input-output control circuit IOC reads data from the memory cell MC according to the read instruction, the input-output control circuit IOC outputs data as an output data DO.

The memory cell MC includes an area shown by a redundancy address except addresses ADD1 to ADDn specified from outside. The redundancy address is a substitution destination address used instead of the address internally, when there is a failure in the area shown by the redundancy address specified from outside in areas of the memory cell MC.

The redundancy determination circuit RJ1 receives the clock signal CLK and the test signal TEST, and outputs a redundancy determination signal QR1 indicating presence or absence of a failure in the area according to a disconnect situation of a fuse corresponding to an area shown by the address ADD1. The redundancy determination circuit RJ1 includes a fuse circuit RF1 and a semiconductor device 101. The fuse circuit RF1 outputs a fuse data FD1 which is a signal that shows one of two values indicating occurrence of disconnection according to the disconnect situation of a fuse. The semiconductor device 101 includes a configuration equal to the above mentioned semiconductor device 100. The semiconductor device 101 receives the fuse data FD1 as the input data D, receives a clock signal CLK and a test signal TEST, and outputs a redundancy determination signal QR1 to the redundancy address decoder RDE. Note that, details of the redundancy determination circuit RJ1 are described later in FIG. 8.

The redundancy determination circuits RJ2 to RJn have configurations equal to that of the redundancy determination circuit RJ1. For example, the redundancy determination circuit RJ2 includes a fuse circuit RF2 and a semiconductor device 102. The fuse circuit RF2 outputs the fuse data FD2 to the semiconductor device 102 according to a disconnect situation of a fuse corresponding to an area shown by the address ADD2. The semiconductor device 102 has the a configuration equal to that of the above mentioned semiconductor device 100. The semiconductor device 102 receives the fuse data FD2 as the input data D, receives the clock signal CLK and the test signal TEST, and outputs a redundancy determination signal QR2 to the redundancy address decoder RDE. Further, for example, the redundancy determination circuit RJn outputs the redundancy determination signal QRn indicating presence or absence of a failure in the area according to a disconnect situation of a fuse corresponded to an area shown by the address ADDn. Other configurations are similar to those of the redundancy determination circuit RJ1, thereby an explanation is omitted.

The redundancy address decoder RDE receives the addresses ADD1 to ADDn specified from outside and the redundancy determination signals QR1 to QRn from the redundancy determination circuits RJ1 to RJn. Further, when there is the failure in the redundancy determination signals QR1 to QRn, the redundancy address decoder RDE outputs the redundancy addresses RAD1 to RADn corresponding to the addresses ADD1 to ADDn to the address decoder ADE.

The address decoder ADE receives the addresses ADD1 to ADDn specified from outside and the redundancy addresses RAD1 to RADn. The address decoder ADE normally outputs the received addresses ADD1 to ADDn. When the address decoder ADE also receives the redundancy addresses RAD1 to RADn in addition to the addresses ADD1 to ADDn, it outputs the redundancy addresses RAD1 to RADn.

Figure 8:
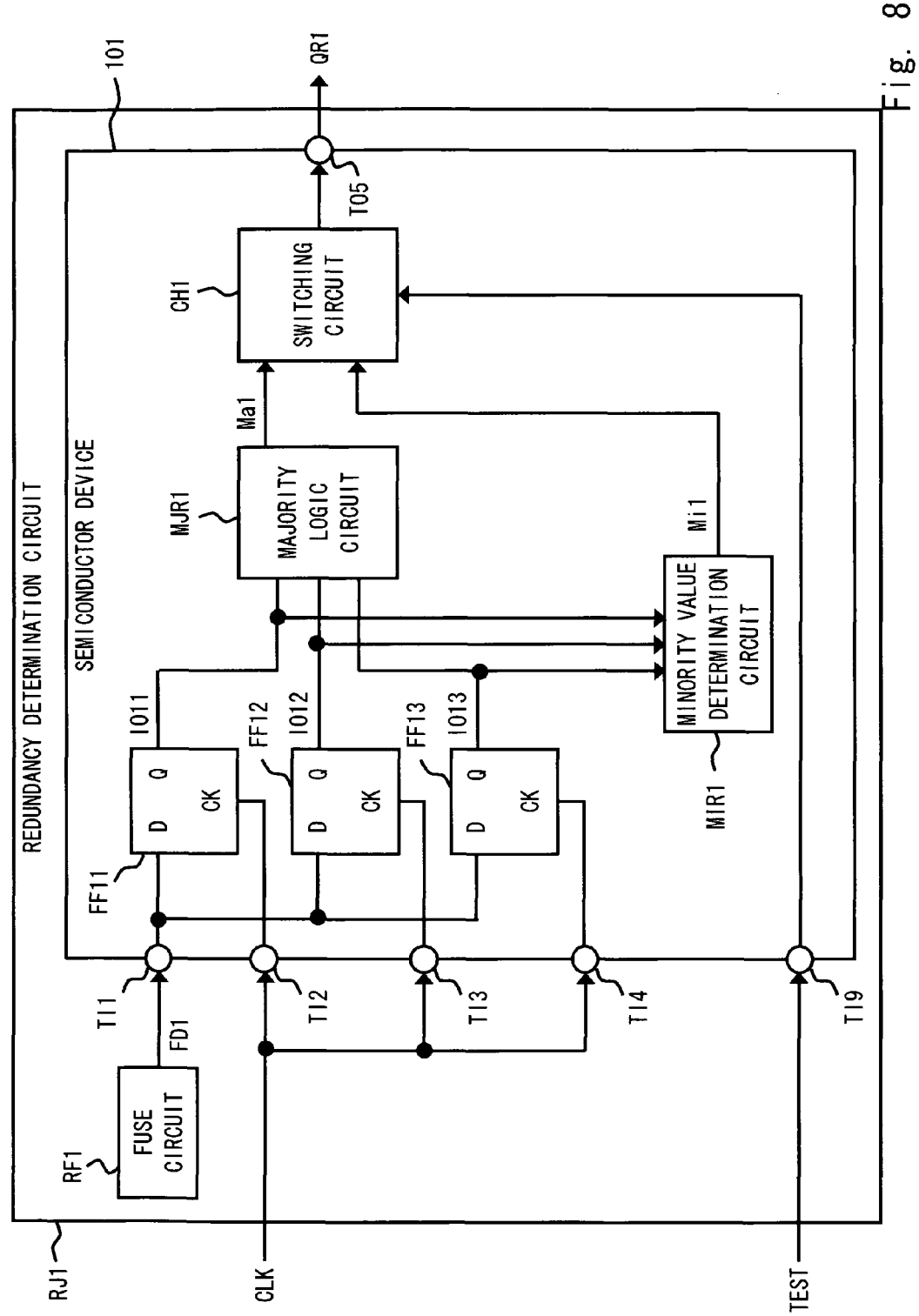
FIG. 8 is a block diagram showing a configuration of a redundancy determination circuit according to a third embodiment of the present invention.

FIG. 8 is a block diagram showing a configuration of the redundancy determination circuit RJ1 according to the third embodiment of the present invention. The redundancy determination circuit RJ1 includes, as presented above, the fuse circuit RF1 and the semiconductor device 101. The semiconductor device 101 includes flip-flop circuits FF11 to FF13, a majority logic circuit MJR1, a minority value determination circuit MIR1, and a switching circuit CH1. Note that, other configurations of the semiconductor device 101 are similar to those of the semiconductor device 100, thereby an explanation is omitted.

Each of the flip-flop circuits FF11 to FF13 receives the fuse data FD1 through the input terminal TI1 and the clock signal CLK through each of the input terminals TI2 to TI4. The flip-flop circuits FF11 to FF13 output the flip-flop output signals IO11 to IO13 according to the clock signal CLK, respectively, and supplies the flip-flop output signals IO11 to IO13 to the majority logic circuit MJR1 and the minority value determination circuit MIR1. The flip-flop output signals IO11 to IO13 are signals indicating holding status of the fuse data FD1 in the flip-flop circuits FF11 to FF13. Therefore, when the signals held in the flip-flop circuits FF11 to FF13 invert by an influence of alpha rays, a signal which is different from a signal at an original disconnect situation of a fuse is output as the flip-flop output signals IO11 to IO13.

The majority logic circuit MJR1 receives the flip-flop output signals IO11 to IO13, outputs the majority value signal Ma1, and supplies the majority value signal Ma1 to the switching circuit CH1. The minority value determination circuit MIR1 receives the flip-flop output signals IO11 to IO13, outputs the minority value signal Mi1, and supplies the minority value signal Mi1 to the switching circuit CH1. The switching circuit CH1 receives the majority value signal Ma1, the minority value signal Mi1, and a test signal TEST, selects one of the majority value signal Ma1 and the minority value signal Mi1 according to the test signal TEST, and outputs the selected signal as the output signal QR1.

FIG. 9 is a diagram showing an operational truth table on the redundancy determination circuit RJ1 according to the third embodiment of the present invention. Items of the operational truth table shown in FIG. 9 show the fuse data FD1, the flip-flop output signals IO11 to IO13, QR1 (Ma1) and QR1 (Mi1), and selected results of the address decoder ADE at QR1 (Ma1) and QR1 (Mi1). The QR1 (Ma1) shows the redundancy determination signal QR1 when the test signal TEST is "0", that is, the majority value signal Ma1. The QR1 (Mi1) shows the redundancy determination signal QR1 when the test signal TEST is "1", that is, the minority value signal Mi1. The selected result shows whether an address selected by the address decoder ADE is the address ADD1 or the redundancy address RAD1.

An operation when there is no failure in the redundancy determination circuit RJ1, is described with reference to FIG. 9. First, when a fuse of the fuse circuit RF1 is still connected, the semiconductor device 101 receives the fuse data FD1 as "0". In this case, the flip-flop circuits FF11 to FF13 output the flip-flop output signals IO11 to IO13 as "0". Further, the majority logic circuit MJR1 and the minority value determination circuit MIR1 output the majority value signal Ma1 and the minority value signal Mi1 as "0" to the switching circuit CH1. Regardless of whether the test signal TEST is "0" or "1", the switching circuit CH1 outputs the redundancy determination signal QR1 as "0" to the redundancy address decoder RDE. Therefore, the redundancy address decoder RDE does not output the redundancy address RAD1 to the address decoder ADE. Accordingly, the address decoder ADE selects the address ADD1.

That is, when there is no failure in the redundancy determination circuit RJ1, and when the fuse of the fuse circuit RF1 is still connected, the input-output control circuit IOC accesses to the address ADD1 of the memory cell MC as shown by #1 of FIG. 9, regardless of whether the test signal TEST is "0" or "1".

Subsequently, described is a case in which there is no failure in the redundancy determination circuit RJ1 and when the fuse of the fuse circuit RF1 has been already disconnected, that is, when there is the failure in the area shown by the address ADD1. First, the flip-flop circuits FF11 to FF13 output the flip-flop output signals IO11 to IO13 as "1", because the fuse data FD1 is "1". The majority logic circuit MJR1 and the minority value determination circuit MIR1 outputs the majority value signal Ma1 and the minority value signal Mi1 as "1" to the switching circuit CH1. Regardless of whether the test signal TEST is "0" or "1", the switching circuit CH1 outputs the redundancy determination signal QR1 as "1" to the redundancy address decoder RDE. Therefore, the redundancy address decoder RDE outputs the redundancy address RAD1 to the address decoder ADE. Accordingly, the address decoder ADE selects the redundancy address RAD1.

That is, when there is no failure in the redundancy determination circuit RJ1, and when the fuse of the fuse circuit RF1 has been already disconnected, the input-output control circuit IOC accesses to the redundancy address RAD1 of the memory cell MC as shown by #16 of FIG. 9, regardless of whether the test signal TEST is "0" or "1".

Next, An operation when there is the failure in the flip-flop circuits FF11 to FF13 mounted on the redundancy determination circuit RJ1 will be described. For example, #2 of FIG. 9 shows a case in which there is the failure only in the flip-flop circuit FF13, and when the fuse of the fuse circuit RF1 is still connected. In this case, first, the flip-flop circuits FF11 and FF12 output the flip-flop output signals IO11 and IO12 as "0", because the fuse data FD1 is "0". However, the flip-flop circuit FF13 outputs the flip-flop output signal IO13 as "1". Further, the majority logic circuit MJR1 outputs the majority value signal Ma1 as "0". Furthermore, the minority value determination circuit MIR1 outputs the minority value signal Mi1 as "1" to the switching circuit CH1. After that, when the test signal TEST is "0", the switching circuit CH1 outputs the redundancy determination signal QR1 as "0". Therefore, the redundancy address decoder RDE does not output the redundancy address RAD1 to the address decoder ADE. Accordingly, the address decoder ADE selects the address ADD1.

By contrast, when the test signal TEST is "1", the switching circuit CH1 outputs the redundancy determination signal QR1 as "1". Therefore, the redundancy address decoder RDE outputs the redundancy address RAD1 to the address decoder ADE. Accordingly, the address decoder ADE selects the redundancy address RAD1.

That is, when there is the failure only in the flip-flop circuit FF13, and when the fuse of the fuse circuit RF1 is still connected, an address selected by the address decoder ADE when the test signal TEST is "0" is different from an address selected by the address decoder ADE when the test signal TEST is "1", as shown by #2 of FIG. 9. Therefore, addresses accessed to the memory cell MC are different.

In the same way, also when there is the failure in one or two of circuits in the flip-flop circuits FF11 to FF13, the addresses selected by the address decoder ADE are different as shown by #3 to #7 of FIG. 9. Moreover, also when the fuse of the fuse circuit RF1 has been already disconnected, the addresses selected by the address decoder ADE are different as shown by #10 to #15 of FIG. 9.

Therefore, the failure detection method of the data hold circuits according to the third embodiment of the present invention includes, first, supplying an input value to each of the N pieces of data hold circuits, the input value indicating presence or absence of a failure in an area shown by an address of the memory cell MC. Secondly, the method includes outputting a first output value of a majority of output values received from the N pieces of the data hold circuits when receiving a write instruction to write input data to a first address of the memory cell MC. Further, the method includes determining whether there is the failure in the area based on the first output value and writing the input data to the first address when there is no failure in the area. Alternatively, the method includes writing the input data to a second address when there is the failure in the area, the second address being different from the first address.

After that, the method includes outputting a second output value which is less than the majority of output values received from the N pieces of the data hold circuits when receiving a read instruction to read output data from the first address of the memory cell MC. Further, the method includes determining whether there is the failure in the area based on the second output value, and reading the output data from the first address when there is no failure in the area. Alternatively, the method includes reading the output data from the second address when there is the failure in the area. After that, the method includes detecting that there is the failure in the N pieces of the data hold circuits according to the input data and the output data that is read.

Herewith, it is possible to provide a versatile test method of the memory cell MC itself to write data to the memory cell MC and to read data from the memory cell MC, and also to detect effectively that there is the failure in the data hold circuits. Accordingly, it is possible to shorten the test time.

Further, it is preferable to detect that there is the failure in a part of the N pieces of the data hold circuits when the input data is different from the output data that is read.

In this way, when there is the failure in a part of the N pieces of the data hold circuits, the first output value and the second output value are different. Therefore, when there is no failure in the area shown by the address of the memory cell MC, the input value is written to the second address, because the second output value indicates that there is the failure in the area. By contrast, the output value is read from the first address, because the first output value indicates that there is no failure in the area. Therefore, a data difference occurs, because the input value and the output value are stored in different addresses. Herewith, it can detect that there is the failure in a part of the N pieces of the data hold circuits.

Furthermore, it is preferable to supply a first value as the input value to each of the N pieces of data hold circuits, and to supply a second value that is different from the first value as the input value to each of the N pieces of data hold circuits, when the input data and the output data that is read match. Herewith, even if the input value and the output value match by chance, it compares with different values as the input data afterward, thereby it can improve accuracy of failure detection.

Figure 10:
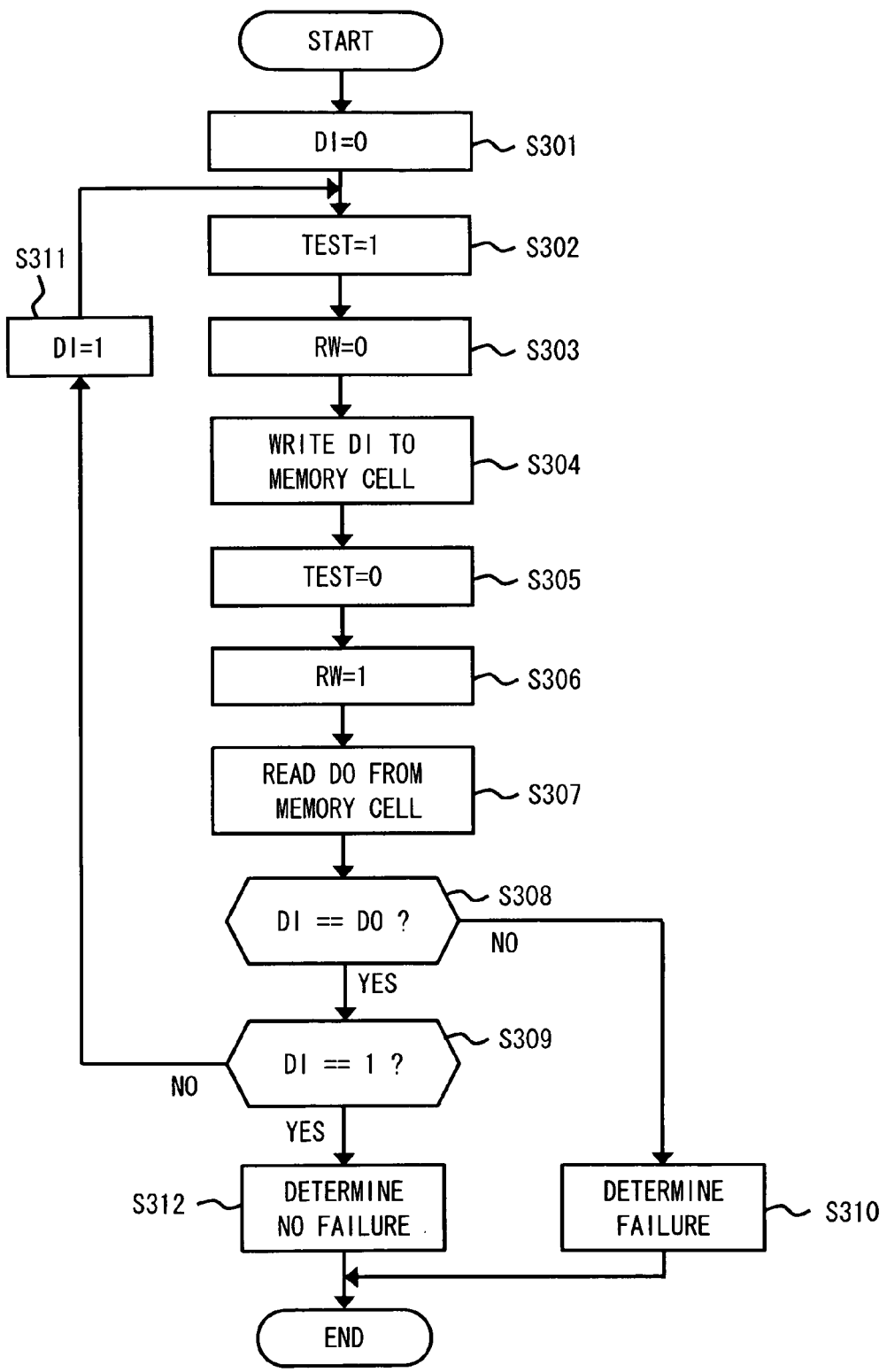
FIG. 10 is a flowchart showing the flow of a failure detection test according to the third embodiment of the present invention.

FIG. 10 is a flowchart showing the flow of a failure detection test according to the third embodiment of the present invention. Note that, the following failure detection test can be realized by using one of a test device and computer program for the test of the memory cell.

First, the semiconductor storage device 300 sets the input data DI to "0" (S301). Secondly, the semiconductor storage device 300 sets the test signal TEST to "1" (S302). Herewith, the switching circuits CH1 to CHn included in the redundancy determination circuits RJ1 to RJn select the minority value signals Mi1 to Min, and output the selected signals as the redundancy determination signals QR1 to QRn. Further, the semiconductor storage device 300 sets the control signal RW to "0" (S303).

After that, the semiconductor storage device 300 receives the write instruction to write the input data DI to all addresses of the memory cell MC (S304). In this case, the redundancy determination circuits RJ1 to RJn output the redundancy determination signals QR1 to QRn according to the disconnect situation of the fuse corresponding to the area shown by the address. Further, the redundancy address decoder RDE determines whether there are output values of the redundancy addresses RAD1 to RADn according to the redundancy determination signals QR1 to QRn. The address decoder ADE selects an address according to output values from the redundancy address decoder RDE. After that, the input-output control circuit IOC writes the input data DI to the selected address.

A fuse disconnect process is performed on the address which is determined as a failure cell on a production process, thereby the fuse disconnection has been finished in the memory cell MC. Therefore, the redundancy address decoder RDE substitutes the addresses in which the fuse disconnection has been finished with the redundancy addresses RAD1 to RADn. As presented above, when there is the failure in the redundancy determination circuits RJ1 to RJn, the redundancy determination signals QR1 to QRn may be different from values of the fuse data FD1 to FDn.

Accordingly, when the memory cell MC includes the addresses in which the fuse disconnection has been finished, and when there is no failure in the redundancy determination circuits RJ1 to RJn, the input-output control circuit IOC writes the input data DI to the redundancy addresses RAD1 to RADn. Regardless of whether the memory cell MC includes the addresses which are finished disconnect of the fuse, when there is the failure in the redundancy determination circuits RJ1 to RJn, the input-output control circuit IOC writes the input data DI to an address according to the example of FIG. 9.

After that, the semiconductor storage device 300 sets the test signal TEST to "0" (S305). Herewith, the switching circuits CH1 to CHn included in the redundancy determination circuits RJ1 to RJn select the majority value signals Ma1 to Man, and output the selected signals as the redundancy determination signals QR1 to QRn. Further, the semiconductor storage device 300 sets the control signal RW to "1" (S306).

The semiconductor storage device 300 receives the read instruction of the output data DO from all addresses of the memory cell MC (S307). In this case, the input-output control circuit IOC reads the output data DO from the address selected by the address decoder ADE. In this case, similarly to the step S304, regardless of whether the memory cell MC includes the addresses which are finished disconnect of the fuse, when there is the failure in the redundancy determination circuits RJ1 to RJn, the input-output control circuit IOC reads the output data DO from the address according to the example of FIG. 9. In this case, when there is the failure in a part of the flip-flop circuits at each of the redundancy determination circuits RJ1 to RJn, addresses of access target are different, because the redundancy determination signals QR1 to QRn at writing are different from the redundancy determination signals QR1 to QRn at reading.

After that, the semiconductor storage device 300 determines whether the input data DI and the output data DO match (S308). When the input data DI and the output data DO match, the semiconductor storage device 300 determines whether the input data DI is "1" (S309). When the input data DI is not "1", the semiconductor storage device 300 sets the input data DI to "1" (S311). Further, it executes the steps S302 to S309. Herewith, even if the output data DO matches the input data DI by chance because the output data DO is "0" when an address of writing destination was different from an address of reading destination, it can improve accuracy of failure detection, because it is compared with the different input data DI again.

After that, it is determined that the input data DI is "1" by the step S309, and the semiconductor storage device 300 determines that there is no failure in the redundancy determination circuits RJ1 to RJn, for example "Pass" (S312).

Meanwhile, when it is determined that the input data DI and the output data DO does not match by the step S308, the semiconductor storage device 300 determines that there is the failure in a redundancy determination circuit corresponding to an address in which data do not match data, for example, "Fail" (S310). In this case, a defective treatment is performed on the redundancy determination circuit in which it is determined that there is the failure. For example, the redundancy determination circuit is exchanged, or the like.

After the step S310 or S312, the failure detection test terminates.

Herewith, by executing the failure detection test according to the third embodiment of the present invention, it can perform the failure detection of a plurality of flip-flop circuits mounted on the redundancy determination circuits RJ1 to RJn, at the test of a writing operation and a reading operation of the memory cell MC. Therefore, it is not necessary to perform a separate special test to detect the failure in a redundancy determination circuit, thereby it can suppress the test time spent at the production process.

[Other Embodiments]

Note that, the semiconductor device 100 according to the first embodiment of the present invention is a test circuit including a majority logic circuit, a minority value determination circuit, and a switching circuit. In this case, the majority logic circuit receives output values of at least three flip-flop circuits. Further, the minority value determination circuit receives output values of at least three flip-flop circuits, compares the number of "0" and "1" supplied, and outputs a logical value less than the majority. The switching circuit selects an output value of the majority logic circuit or an output value of the minority value determination circuit according to a test signal. Herewith, it sets only two test values, and it selects and tests the output value of the majority logic circuit or the output value of the minority value determination circuit according to the test signal, thereby it can perform the failure detection of the flip-flop circuit. Therefore, it can reduce the number of combination of test values at tests of the test mode and the usual mode required at the scan test circuit 900*a*, thereby there is an effect of shortening the test time.

That is, there is an effect of shortening the test time of the failure detection of the flip-flop circuits at the semiconductor device including the flip-flop circuits of the alpha-ray-resistance. This is because it is not necessary to execute tests to sequentially set again all combinations of holding data of the flip-flop circuits executed at the scan test of the scan test circuit 900*a*, and it can perform the failure detection in shorter time than the test of the scan test circuit 900*a* of Japanese Unexamined Patent Application Publication No. 2002-185309.

The present invention is not limited to the above-described exemplary embodiments, but various modifications can be made as appropriate to the exemplary embodiments without departing from the spirit and scope of the present invention.

The first, second and third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
    a first circuit that outputs a first output value of a majority of output values received from N (N is three or more odd numbers) pieces of data hold circuits receiving a same input value;
    a second circuit that outputs a second output value which is less than the majority of output values received from the N pieces of the data hold circuits; and
    an output selection circuit that selects one of the first output value and the second output value according to an instruction from outside, and outputs the selected value.

2. The semiconductor device according to claim 1, wherein the output selection circuit determines whether the instruction indicates a usual operation or a test operation, selects and outputs the first output value when it is determined the instruction indicates the usual operation, and selects and outputs the second output value when it is determined the instruction indicates the test operation.

3. The semiconductor device according to claim 1, wherein when all of output values received from the N pieces of the data hold circuits coincide with one another, the second circuit outputs the coincided output value as the second output value.

4. The semiconductor device according to claim 1, wherein the data hold circuits are flip-flop circuits.

5. A failure detection system of data hold circuits comprising:
    a first circuit that outputs a first output value of a majority of output values received from N (N is three or more odd numbers) pieces of data hold circuits receiving a same input value;
    a second circuit that outputs a second output value which is less than the majority of output values received from the N pieces of the data hold circuits;
    a detection circuit that detects that there is a failure in the N pieces of the data hold circuits based on at least the second output value; and
    an output selection circuit that receives the first output value and the second output value, selects one of the first output value and the second output value according to an instruction from outside, and outputs the selected value.

6. The failure detection system of the data hold circuits according to claim 5, wherein the detection circuit detects that there is the failure in the data hold circuits of less than the majority of the N pieces of the data hold circuits, when the second output value is different from the input value.

7. The failure detection system of the data hold circuits according to claim 5, wherein the detection circuit detects that there is the failure in a part of the N pieces of the data hold circuits, when the first output value is different from the second output value.

8. The failure detection system of the data hold circuits according to claim 5, wherein:
    when all of output values received from the N pieces of the data hold circuits coincide with one another, the second circuit outputs the coincided output value as the second output value, and
    the detection circuit performs the detection according to the input value and one of the first output value and the second output value, when the first output value and the second output value match.

9. The failure detection system of the data hold circuits according to claim 5, wherein the detection circuit detects that there is the failure in all of the N pieces of the data hold circuits, when the first output value and the second output value match, and when one of the first output value and the second output value is different from the input value.

10. The failure detection system of the data hold circuits according to claim 5,
    wherein the detection circuit performs the detection according to the output value received from the output selection circuit and the input value.

11. A failure detection method of data hold circuits comprising:
    outputting a first output value of a majority of output values received from N (N is three or more odd numbers) pieces of data hold circuits receiving a same input value;
    outputting a second output value which is less than the majority of output values received from the N pieces of the data hold circuits;
    detecting that there is a failure in the N pieces of the data hold circuits based on at least the second output value;
    receiving the first output value and the second output value, selecting one of the first output value and the second output value according to an instruction from outside,
    outputting the selected value, and
    performing the detection according to the selected value to be output and the input value.

12. The failure detection method of the data hold circuits according to claim 11, comprising detecting that there is the failure in the data hold circuits of less than the majority of the N pieces of the data hold circuits, when the second output value is different from the input value.

13. The failure detection method of the data hold circuits according to claim 11, comprising
    detecting that there is the failure in a part of the N pieces of the data hold circuits, when the first output value is different from the second output value.

14. The failure detection method of the data hold circuits according to claim 11, comprising
    when all of output values received from the N pieces of the data hold circuits coincide with one another, outputting the output value as the second output value, and
    performing the detection according to the input value and one of the first output value and the second output value, when the first output value and the second output value match.

15. The failure detection method of the data hold circuits according to claim 11, comprising
    detecting that there is the failure in all of the N pieces of the data hold circuits, when the first output value and the second output value match, and when one of the first output value and the second output value is different from the input value.

16. A failure detection method of N (N is three or more odd numbers) pieces of data hold circuits mounted on a semiconductor device, the failure detection method comprising:
    supplying an input value to each of the N pieces of data hold circuits, the input value indicating presence or absence of a failure in an area shown by an address of a memory;
    outputting a first output value of a majority of output values received from the N pieces of the data hold circuits when receiving a write instruction to write input data to a first address of the memory;
    determining whether there is the failure in the area based on the first output value;
    writing the input data to the first address when there is no failure in the area;
    writing the input data to a second address when there is the failure in the area, the second address being different from the first address;
    outputting a second output value which is less than the majority of output values received from the N pieces of the data hold circuits when receiving a read instruction to read output data from the first address of the memory;
    determining whether there is the failure in the area based on the second output value;
    reading the output data from the first address when there is no failure in the area;
    reading the output data from the second address when there is the failure in the area; and
    detecting that there is the failure in the N pieces of the data hold circuits according to the input data and the output data that is read.

17. The failure detection method of the data hold circuits according to claim 16, comprising
    detecting that there is the failure in a part of the N pieces of the data hold circuits when the input data is different from the output data that is read.

18. The failure detection method of the data hold circuits according to claim 16, comprising
    supplying a first value as the input value to each of the N pieces of data hold circuits, and
    supplying a second value as the input value to each of the N pieces of data hold circuits, the second value being different from the first value, when the input data and the output data that is read match.

* * * * *